United States Patent
Kerselaers

(10) Patent No.: US 10,326,536 B2
(45) Date of Patent: Jun. 18, 2019

(54) ELECTROMAGNETIC DEVICE FOR DAMPING A FIRST CIRCUIT WITH RESPECT TO A SECOND CIRCUIT

(71) Applicant: NXP B.V., Eindhoven (NL)

(72) Inventor: Anthony Kerselaers, Herselt (BE)

(73) Assignee: NXP B.V., Eindhoven (NL)

( * ) Notice: Subject to any disclaimer, the term of this patent is extended or adjusted under 35 U.S.C. 154(b) by 663 days.

(21) Appl. No.: 14/880,625

(22) Filed: Oct. 12, 2015

(65) Prior Publication Data

US 2017/0104547 A1   Apr. 13, 2017

(51) Int. Cl.

| | |
|---|---|
| H04B 15/02 | (2006.01) |
| H04W 4/80 | (2018.01) |
| H02J 3/01 | (2006.01) |
| H04B 1/00 | (2006.01) |
| H05K 9/00 | (2006.01) |
| H01Q 1/24 | (2006.01) |
| H01Q 1/52 | (2006.01) |

(52) U.S. Cl.
CPC ............. H04B 15/02 (2013.01); H01Q 1/243 (2013.01); H01Q 1/52 (2013.01); H02J 3/01 (2013.01); H04B 1/00 (2013.01); H04W 4/80 (2018.02); H05K 9/0071 (2013.01)

(58) Field of Classification Search
CPC .......... H04B 15/02; H04B 1/00; H04W 4/80; H04W 4/008; H01Q 1/52; H01Q 1/243; H05K 9/0071; H02J 3/01
See application file for complete search history.

(56) References Cited

U.S. PATENT DOCUMENTS

| | | | | |
|---|---|---|---|---|
| 4,901,015 A | * | 2/1990 | Pospischil | G01P 3/488 324/174 |
| 6,631,178 B1 | * | 10/2003 | Blackwell | H04M 1/24 375/219 |
| 2008/0158091 A1 | * | 7/2008 | Imaoka | H01Q 1/2283 343/851 |
| 2013/0012808 A1 | * | 1/2013 | Govari | A61B 5/062 600/424 |

FOREIGN PATENT DOCUMENTS

| | | |
|---|---|---|
| EP | 2543314 A1 | 1/2013 |
| EP | 2733738 A2 | 5/2014 |
| EP | 2733738 A3 | 5/2014 |
| JP | 2009038785 A * | 2/2009 |
| JP | 2009038785 A1 | 2/2009 |

* cited by examiner

*Primary Examiner* — Jared Fureman
*Assistant Examiner* — Michael J Warmflash

(57) ABSTRACT

One example discloses an electromagnetic device, including: a first circuit, configured to generate a first electromagnetic field; a second circuit responsive to the first electromagnetic field; a damping circuit configured to generate a second electromagnetic field in response to a current induced by the first electromagnetic field; and wherein the second electromagnetic field reduces the second circuit's responsiveness to the first electromagnetic field.

20 Claims, 6 Drawing Sheets

ELECTROMAGNETIC DEVICE FOR DAMPING A FIRST CIRCUIT WITH RESPECT TO A SECOND CIRCUIT

The present specification relates to systems, methods, apparatuses, devices, articles of manufacture and instructions relating to an electromagnetic device.

Electronic devices that are able to communicate with each other can make use of a variety of communication methods, like electromagnetic far-field radiation or near-field inductive coupling. Bluetooth (BT) for example is a standard that makes use of electromagnetic far-field radiation while magnetic induction (MI) for example is a method that makes use of coupling between devices by means of near-fields.

Electronic devices can have small dimensions, for example an integrated circuit (IC) or wearable devices like hearing aids, earbuds, smart watches and other. Small sized devices may have many different parts integrated like electronic circuitry, mechanical components and dielectric materials. All these components can be very close packed together and may influence each other.

If such an electronic device contains a communication system it can include a transmitter, receiver or transceiver, connected to an antenna. In some devices the antenna can be integrated/embedded in the device's housing. Such an antenna transmits or receives signals from other devices to establish communication. The received signal quality by the antenna can be defined by a certain signal to noise ratio. For successful communication the signal to noise ratio should be sufficient high. Only with a sufficient signal to noise ratio can a demodulator in the device's radio receiver be able to demodulate without distortion or bit errors.

Electronic circuits and its connections however generate electromagnetic fields and can degrade the communication range severely. While electronic devices often have to comply with electromagnetic compatibility standards (EMC), the requirements of such standards are not always sufficient to guarantee no degradation of the communication link performance in a small sized communication device with an antenna close to the electronic circuits and its connections.

Instead, a device's electronic circuitry and inter-component connections can generate electromagnetic interference (i.e. baseband frequency harmonics that can combine with and degrade signals at the antenna's operating frequency). For example, wires (e.g. digital interface lines) transporting audio content [$I^2S$] can generate strong electromagnetic interference.

In another example, wirelessly connected wearable devices often use a class D audio amplifier due to such amplifier's high efficiency. The Class D amplifier is a digital amplifier where its audio content can be in the form of a pulse position modulation signal. Such baseband amplifier signals can be directly wired to the wearable device's loudspeaker. Such wires however can generate a high-level of electromagnetic interference (i.e. baseband frequency harmonics) in the wireless device's higher frequency wireless communication channel, since the wireless device's antenna is positioned close to the baseband electronic circuitry and its wires to the loudspeaker. Such interference degrades (i.e. raises the noise floor of) the wireless device's communication channel and lower the communication system's signal to noise ratio. This in turn reduces the wearable device's communication range.

Metal shielding (e.g. Faraday cage) around electronic circuits can reduce the electromagnetic interference; however, such shielding can be bulky and undesirably damp an electronic device's antenna.

Other methods used in larger electronic devices include: ground planes, filtering and other types of shielding. However, small devices often do not have the space to integrate such solutions.

SUMMARY

According to an example embodiment, an electromagnetic device, comprising: a first circuit, configured to generate a first electromagnetic field; a second circuit responsive to the first electromagnetic field; a damping circuit configured to generate a second electromagnetic field in response to a current induced by the first electromagnetic field; and wherein the second electromagnetic field reduces the second circuit's responsiveness to the first electromagnetic field.

In another example embodiment, the damping circuit forms an electrical loop around a portion of the first circuit.

In another example embodiment, the damping circuit forms an electrical loop around all elements within the first circuit.

In another example embodiment, the first circuit further includes a set of non-linear circuits and a set of external electrical interconnections; and the damping circuit encloses the non-linear circuits but does not enclose the set of external electrical interconnections.

In another example embodiment, the damping circuit is physically positioned with respect to the first and second circuits such that the second electromagnetic field reduces the second circuit's responsiveness to the first electromagnetic field.

In another example embodiment, the first electromagnetic field of the first circuit induces a current in the damping circuit that results in an opposite phase field according to Lenz's Law; and the opposite phase field at least partially cancels the first electromagnetic field at a position of the second circuit.

In another example embodiment, the first circuit includes a first set of electrical wires and the damping circuit includes a second set of electrical wires that are isolated from the first set of electrical wires.

In another example embodiment, the damping circuit includes an impedance; and the impedance is configured to set an amplitude of the opposite phase field generated by the damping circuit.

In another example embodiment, the impedance is a capacitor.

In another example embodiment, the impedance is a tunable impedance element configured to variably adjust the amplitude of the opposite phase field in response to an operational mode of the device.

In another example embodiment, the damping circuit includes a set of impedances configured to be switch into or out of the damping circuit to digitally adjust the amplitude of the opposite phase field in response to a set of operational modes of the device.

In another example embodiment, the electromagnetic device further includes a communications system; and the impedance is configured to maximize a signal to noise ratio in the communications system.

In another example embodiment, the damping circuit is configured to reduce the second circuit's responsiveness to a near-field signal emitted by the first circuit.

In another example embodiment, the first circuit further includes at least one of: a transmitter, a receiver, or a transceiver.

In another example embodiment, the damping circuit partially surrounds the first circuit on a hard substrate and partially surrounds the first circuit within an electrical cable.

In another example embodiment, the electromagnetic device includes: a first layer; a second layer; the second layer is either above or below the first layer; the first circuit is within the first layer; and the damping circuit is within the second layer.

In another example embodiment, further comprising a third circuit, configured to generate a third electromagnetic field; the second circuit is also responsive to the third electromagnetic field; a second damping circuit configured to generate a fourth electromagnetic field in response to a current induced by the third electromagnetic field; and the fourth electromagnetic field reduces the second circuit's responsiveness to the third electromagnetic field.

In another example embodiment, the electromagnetic device is at least one of: an electronic communications device; an integrated circuit; a smartphone; a wearable device; a hearing aid; or a smartwatch.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
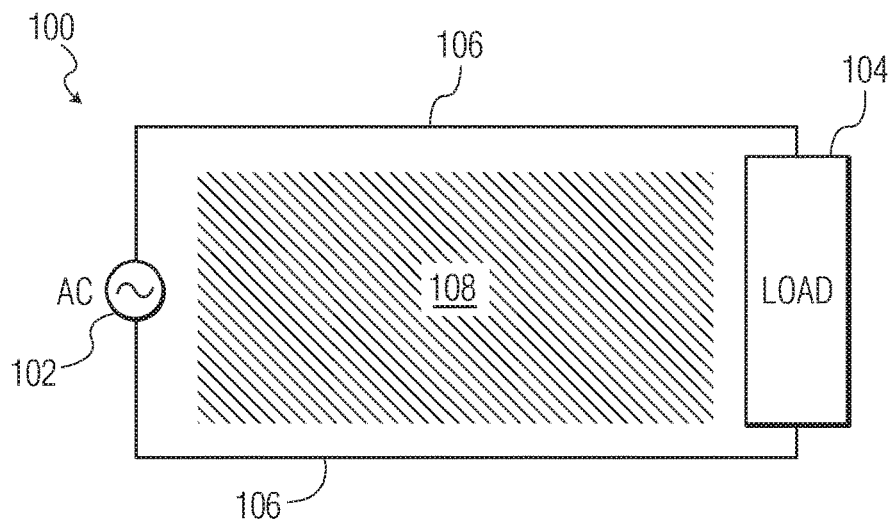
FIG. 1 is a first example of an electromagnetic device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

FIG. 1 is a first example 100 of an electromagnetic device. The first electromagnetic device 100 includes a power source 102, a load 104, and connection wires 106. As a result of the interconnections between these components 102, 104, 106, the first electromagnetic device 100 has an EMI emitting surface area 108.

The power source 102 is connected by means of two connection wires 106 to load 104. The voltage (U) of the power source 102 is generating a current (I) in the closed circuit: I=U/Z, wherein Z is the impedance of the closed circuit.

Since the connection wires 106 are electrically isolated from each other along the length of them they have some physical space between them and form an EMI emitting surface area 108. The current I in the first electromagnetic device 100 generates a magnetic field that is dependent on the EMI emitting surface area 108, current intensity and a distance from the first electromagnetic device 100 at which an EMI reading is measured (i.e. a position of observation).

In a first reference example, a magnetic field strength (e.g. EMI emission) generated by a closed circuit having circular shape can be found by this equation:

$$H = \frac{I \cdot r^2}{2(r^2 + x^2)^{\frac{3}{2}}}$$

H: magnetic field strength
I: current
r: radius of the circular surface
x: distance from the loop along the axis In another reference example, a magnetic field strength generated by a closed circuit with rectangular shape can be found by this equation:

$$H = \frac{I \cdot a \cdot b}{4 \cdot \pi \cdot \sqrt{\left(\frac{a}{2}\right)^2 + \left(\frac{b}{2}\right)^2 + x^2}} \left( \frac{1}{\left(\frac{a}{2}\right)^2 + x^2} + \frac{1}{\left(\frac{b}{2}\right)^2 + x^2} \right)$$

H: magnetic field strength
I: current
a: length of the rectangular surface
b: width of the rectangular surface
x: distance from the loop along the axis An example set of measurements on a rectangular shaped closed EMI emitting circuit, similar to the first electromagnetic device 100, are shown in FIG. 1 and now discussed.

In this example, the EMI emitting circuit has a surface area of 1 cm2 and a current of 100 microAmpere. The EMI emitting circuit generated a magnetic field strength of 60 dbmicroAmpere/meter at a distance of 1 cm.

If this EMI emitting circuit was in a communication system that communicates with magnetic near-field coupling (MI) and the frequency of the circuit, or its harmonics, fall within the communication system's communication channel, then a magnetic antenna of the communication system will receive an undesirable EMI emission field together with a desired magnetic field used for normal communication system messages.

Thus for a communication system whose receiver and antenna have a sensitivity of 24 dbmicroampere/meter, there would be a communication link degradation of about 36 db. This results in a four-times shorter communication distance for the communications system, since the near-field signal has a magnetic field roll off of 18 db/octave, which in some example embodiments is unacceptable.

Figure 2:
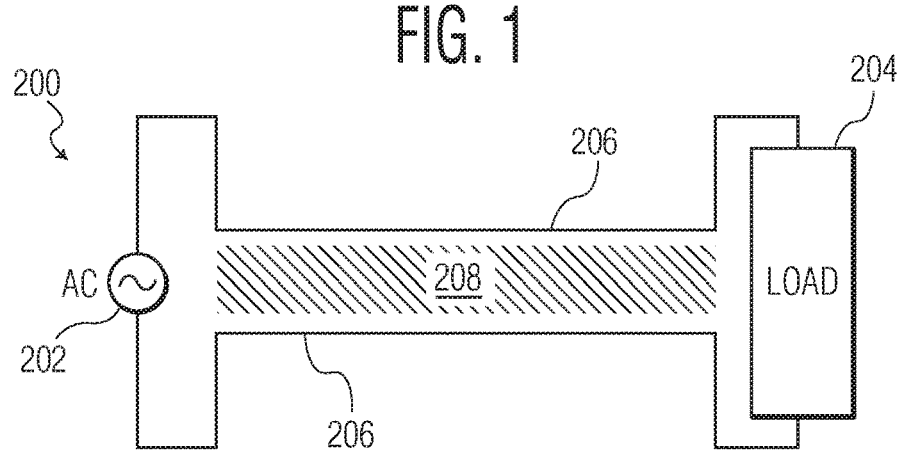
FIG. 2 is a second example of the electromagnetic device.

FIG. 2 is a second example 200 of the electromagnetic device. The second electromagnetic device 200 includes a power source 202, a load 204, and connection wires 206. As a result of these components 202, 204, 206, the second electromagnetic device 200 has an EMI emitting surface area 208.

The second example device 200 can generate less electromagnetic interference (EMI) (e.g. baseband frequency harmonic interference) than the first example device 100 in peripheral electronic circuitry. Given that the relatively large EMI emitting surface area 110 increases an interfering magnetic field, a relatively smaller EMI emitting surface area 210 decreases the interfering magnetic field. However there are physical limits of this reduction since the connection wires 208 must be electrically isolated along their length.

Figure 3:
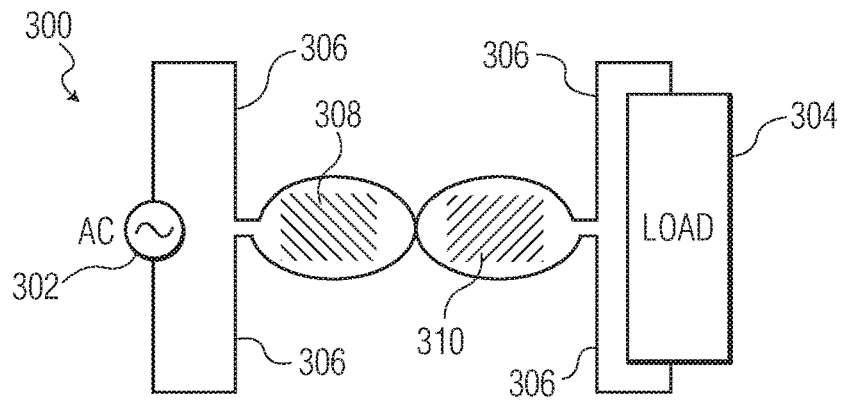
FIG. 3 is a third example of the electromagnetic device.

FIG. 3 is a third example 300 of the electromagnetic device. The third electromagnetic device 300 includes a power source 302, a load 304, and twisted-pair connection wires 306. As a result of these components 302, 304, 306, the third electromagnetic device 300 has a first EMI emitting surface area 308 and a second EMI emitting surface area 310.

This third example device 300 can also generate less electromagnetic interference (EMI) than the first example device 100. The third electromagnetic device 300 can be used with long cables in a so-called twisted-pair arrangement. With the twisted-pair smaller EMI emitting surface areas 308, 310 are created that generate an opposite magnetic field that cancel each other partially. However, the smaller EMI emitting surface areas 308, 310 have variable shapes and thus sometime cancel each other well and other times not so well.

Figure 4:
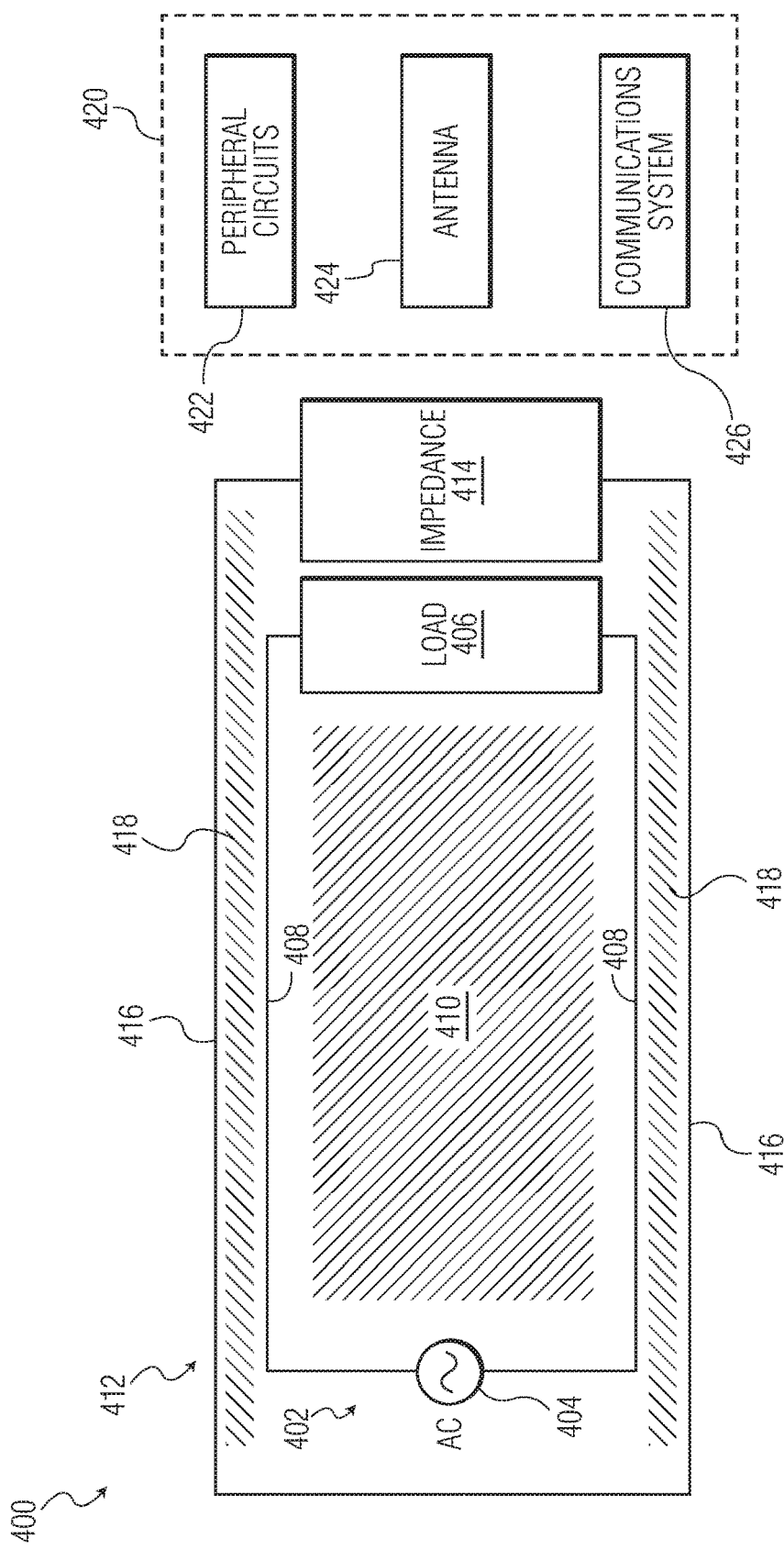
FIG. 4 is a fourth example of the electromagnetic device.

FIG. 4 is a fourth example 400 of the electromagnetic device. The fourth electromagnetic device 400 includes an EMI emitting circuit 402 (e.g. a first circuit). The EMI emitting circuit 402 includes a power source 404, a load 406, and connection wires 408. As a result of these components 404, 406, 408, the fourth electromagnetic device 400 has an EMI emitting surface area 410.

In various examples, the fourth electromagnetic device 400 can be: an electronic communications device; an integrated circuit; a smartphone; a wearable device; a hearing aid; or a smartwatch. Also, the EMI emitting circuit 402 can include: a transmitter, a receiver, or a transceiver.

Proximate to the EMI emitting circuit 402 is a damping circuit 412 (e.g. an EMI canceling loop). The damping circuit 412 includes a connection loop 416 and in some example embodiments also includes an impedance 414. As a result of these components 414, 416 the damping circuit 412 has a damping surface area 418 (surface equivalent shown) that has preferable similar size as EMI emitting surface area 410. Note the damping surface area 418 is the total area formed by the damping circuit 412.

The connection wires 408 within the EMI emitting circuit 402 and the damping circuit 412 are herein defined in various embodiments to include: discrete wires, traces, semiconductor metallization connections, and other forms of conductive material connections for electron current flow.

The damping circuit 412 provides EMI protection from the EMI emitting circuit 402 to a set of isolated circuits 420 (e.g. second circuits), such as peripheral circuits 422 and an antenna 424 connected to the communication system 426.

In operation, the EMI emitting circuit 402 generates a first electromagnetic field. One or more of the isolated circuits 420 are affected by (i.e. responsive to) this first electromagnetic field. The damping circuit 412 is designed to have a coupling factor with the EMI emitting circuit 402. The coupling factor causes the EMI emitting circuit's 402 first electromagnetic field to induce a current in the damping circuit 412 which generates a second electromagnetic field which reduces the affect the first electromagnetic field has on the set of isolated circuits 420.

The first electromagnetic field of the EMI emitting circuit 402 induces in the damping circuit 412 a current according to Faraday's Law. The current in the damping circuit 412 generates a secondary magnetic field. According to Lenz's law, if an induced current flows, its direction is always such that it will oppose the change which produced it. Thus the secondary magnetic field generated by the damping circuit 412 has an opposite phase than the EMI emissions from the EMI emitting circuit 402, and cancels it, at least partially.

In this way the undesirable magnetic field from the EMI emitting circuit 402 is reduced in amplitude to protect the isolated circuits 420 (e.g. the peripheral circuits 410, the antenna 424, the communications system 426, etc.) from EMI interference. The damping surface area 418 of the damping circuit 412 and the induced current define the secondary field amplitude. In some examples, the damping surface area 418 of the damping circuit 412 is constrained by a physical structure of the EMI emitting circuit 402 and other nearby electronic circuitry and thus might not completely optimize cancellation of the EMI emitting circuit's 402 unwanted magnetic field.

In certain examples, the damping circuit's 412 connection loop 416 (e.g. wires) is electrically isolated from the EMI emitting circuit's 402 connection wires 408.

The damping circuit 412 can also be configured to reduce the isolated circuits' 420 responsiveness to a near-field signal emitted by the EMI emitting circuit 402.

For those example embodiments of the damping circuit 412 that include the impedance 414, the impedance is configured to set the secondary field amplitude generated by the damping circuit. The impedance 414 shapes (e.g. tunes) the damping circuit's 412 induced current at various frequencies, so as to maximize the damping circuit's 412 EMI cancellation field over various frequency bands.

Maximum cancellation of the EMI emissions can be achieved by maximizing the coupling factor between the damping circuit 412 and the EMI emitting circuit 402. In some examples, when the damping circuit 412 is positioned near the EMI emitting circuit 402 coupling factors between 0.25-0.95 can be achieved.

Where one of the isolated circuits 420 is the antenna 424 or communications system 426, the impedance 414 can be configured to maximize a signal to noise ratio of the antenna 424 or communications system 426.

In certain example embodiments, the impedance 414 is a tunable impedance element configured to variably adjust the secondary field amplitude in response to changing operational modes of the fourth example device 400. Such operational modes, for example, can serially support multiple communication channels or various high and low power states of the fourth example device 400.

In some examples, the impedance 414 is a capacitor. In other examples, the damping circuit 412 includes a set of impedances (e.g. a set of capacitors) configured to be switch into or out of the damping circuit to digitally adjust the secondary field amplitude in response to the set of operational device modes.

Various examples for physically configuring the damping circuit 412 are now discussed. The damping circuit 412 can form an electrical loop (e.g. a physical perimeter) around all elements in or just a portion of the elements in the EMI emitting circuit 402. If certain non-linear circuits within the EMI emitting circuit 402 generate most of the EMI, then the damping circuit 412 can just enclose the non-linear circuits. Various portions of electrical interconnections between the EMI emitting circuit 402 and the isolated circuits 420 may or may not be EMI protected by the damping circuit 412.

In one example embodiment, the damping circuit 412 does not enclose the EMI emitting circuit 402 but instead can be physically positioned next to (see FIG. 6) the EMI emitting circuit 402 and second circuits such that the damping circuit's 412 electromagnetic field reduces the isolated circuits' 420 responsiveness to the first electromagnetic field. Various portions of the EMI emitting circuit 402 can be distributed over hard substrates (e.g. printed circuit boards) or electrical cables. The damping circuit 412 can just protect the hard substrate portion, the electrical cable portion, or both.

The damping circuit 412 does not need to be in a same plane as the EMI emitting circuit 402. For example, if the electromagnetic device 400 includes a first layer and a second layer, which is either above or below the first layer, then the EMI emitting circuit 402 can be within the first layer and the damping circuit 412 can be within the second layer.

In another example, the fourth electromagnetic device 400 further includes a third circuit (not shown), configured to generate a third electromagnetic field, where the isolated circuits 420 (e.g. the second circuits) are responsive to the third electromagnetic field. In this configuration a second damping circuit (not shown), having a second coupling factor with the third circuit, and configured to generate a fourth electromagnetic field in response to a current induced by the third electromagnetic field due to the second coupling factor. The fourth electromagnetic field reduces the second circuit's responsiveness to the third electromagnetic field.

Thus, the various example embodiments discussed above enable the fourth example device 400 to generate less electromagnetic interference (EMI) than either the first, second or third example devices 100, 200, 300 and significantly reduce unwanted/disturbing magnetic fields, from the EMI emitting circuit 402.

Figure 5:
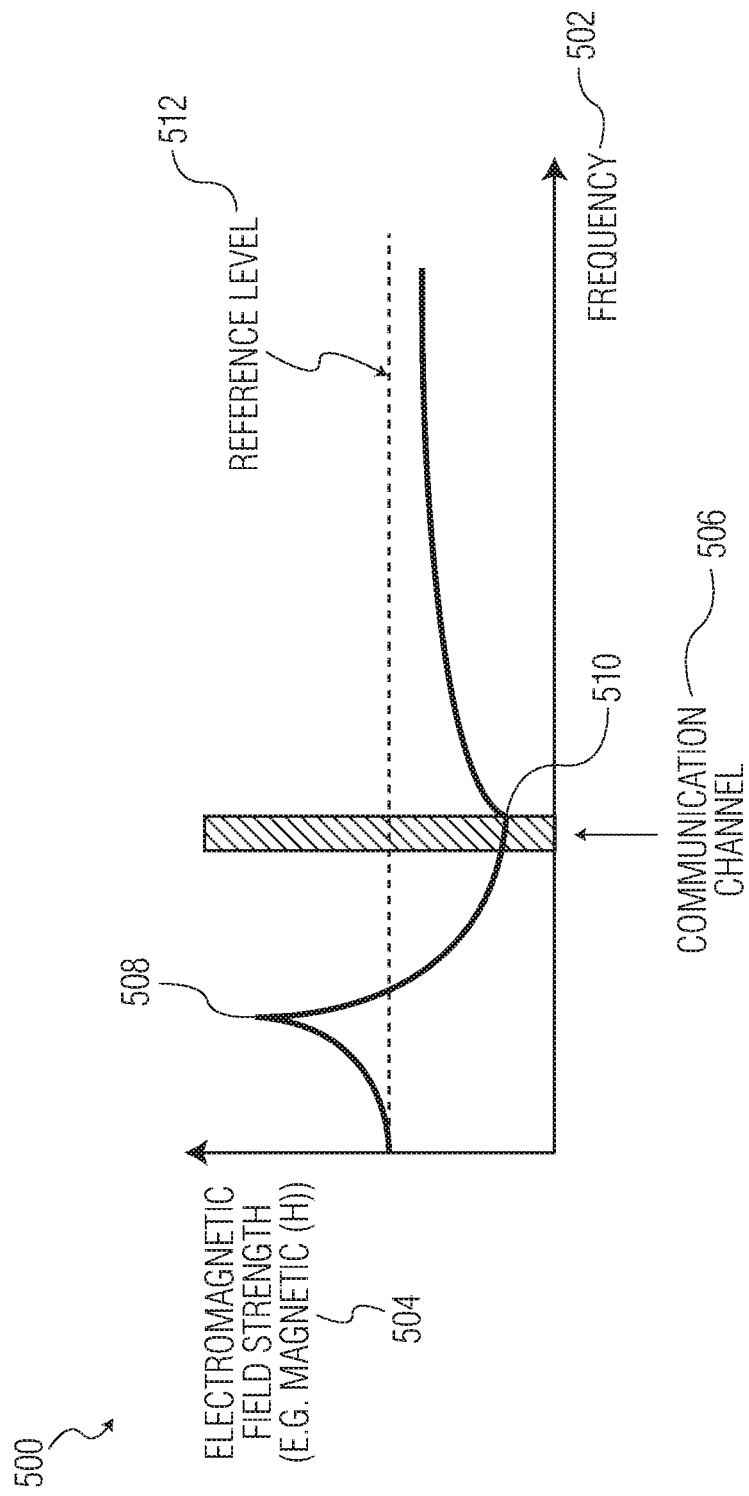
FIG. 5 is an example graph of electromagnetic field strength versus frequency.

FIG. 5 is an example graph 500 of electromagnetic field strength (e.g. magnetic field strength (H)) versus frequency. The graph 500 shows an example set of measurement results for the fourth electromagnetic device 400 shown in FIG. 4.

The graph 500 shows a frequency 502 x-axis, an electromagnetic field strength 504 y-axis, a communication channel 506 region, a first resonance frequency 508, a second resonance frequency 510, and a reference level 512.

The electromagnetic field strength 504 shown in the graph 500 corresponds to a received undesirable magnetic field about 1 cm away from the EMI emitting circuit 402. In this example, the EMI emitting surface area 410 of the EMI emitting circuit 402 is 60 mm$^2$. A radio transceiver (not shown) and connected antenna 424 are positioned about 10 mm away from the EMI emitting circuit 402. This example EMI emitting circuit 402 generates unwanted frequencies between 1 and 33 MHz and the communication channel 506 for the device 400 is at 10.6 MHz.

To facilitate the 10.6 MHz communication channel 506 center frequency, the impedance 414 in the damping circuit 412 is a surface mount capacitor of 5.6 nannofarads. With this impedance 414 value, a current in the damping circuit 412 is minimized at the first resonance frequency 508, at 7.44 MHz and with a quality factor of 12.2.

At the first resonance frequency 508 the damping circuit 412 is in a high impedance state where the undesirable magnetic field emitted by the EMI emitting circuit 402 are not compensated for (e.g. reduced or canceled) since the current through the damping circuit 412 at the first resonance frequency 508 is at a minimum level.

At the second resonance frequency 510 the damping circuit 412 is in a low impedance state where the undesirable magnetic field emitted by the EMI emitting circuit 402 are compensated for (e.g. reduced or canceled) since the current through the damping circuit 412 at the first resonance frequency 508 is at a maximum level.

Through the design selection of the impedance 414, the second resonance frequency 510 is at 10.6 MHz which appropriately corresponds to the desired communication channel 506 frequency band. Within the communication channel 506, the EMI emissions (e.g. EMI harmonics) from the EMI emitting circuit 402 are minimized. The quality factor at the second resonance frequency 510 is 8.4. The amount of current flowing at the second resonance frequency 510 can be adjusted by the quality factor at this frequency. An 18 db EMI reduction has been measured.

As shown in FIG. 5, EMI emissions/interference in the frequencies above 10.6 MHz range above have also been partially cancelled, resulting in a wideband EMI reduction.

Figure 6:
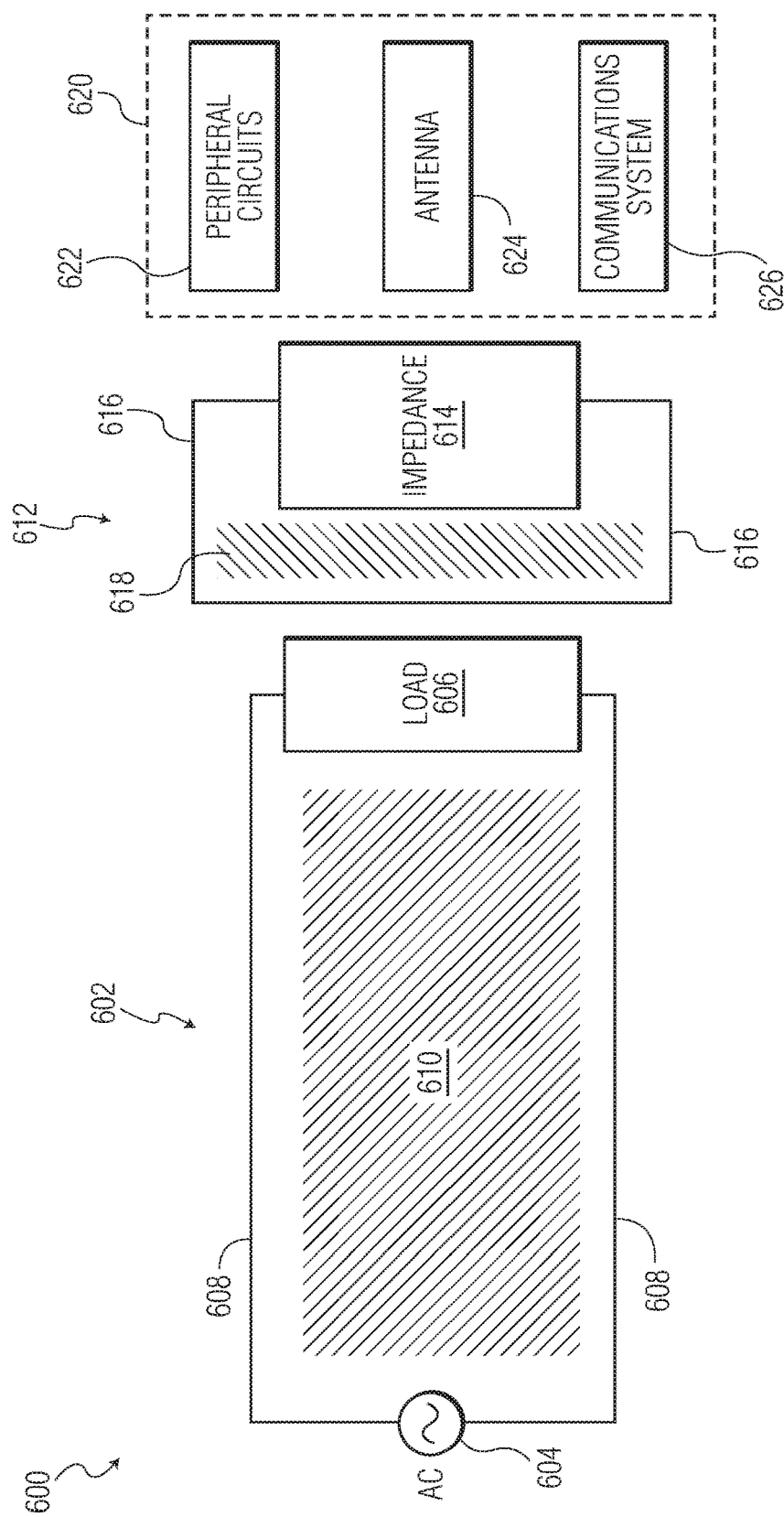
FIG. 6 is a fifth example of the electromagnetic device.

FIG. 6 is a fifth example 600 of the electromagnetic device. The fifth electromagnetic device 600 includes an EMI emitting circuit 602 (e.g. a first circuit). The EMI emitting circuit 602 includes a power source 604, a load 606, and connection wires 608. As a result of these components 604, 606, 608, the fourth electromagnetic device 600 has an EMI emitting surface area 610.

Proximate to the EMI emitting circuit 602 is a damping circuit 612 (e.g. an EMI canceling loop). The damping circuit 612 includes a connection loop 616 and in some example embodiments also includes an impedance 614. As a result of these components 614, 616 the damping circuit 612 has a damping surface area 618 (surface equivalent shown). Note the damping surface area 618 is the total area formed by the damping circuit 612.

The damping circuit 612 provides EMI protection from the EMI emitting circuit 602 to a set of isolated circuits 620 (e.g. second circuits), such as peripheral circuits 622, an antenna 624 connected to the communications system 626.

In this example fifth device 600, the damping circuit 612 is proximate (e.g. near) to the EMI emitting circuit 602 but does not surround the EMI emitting circuit 602 even though they are sufficiently coupled. In one example the example fifth device 600 and the damping circuit 612 are above a low conductive material.

Figure 7:
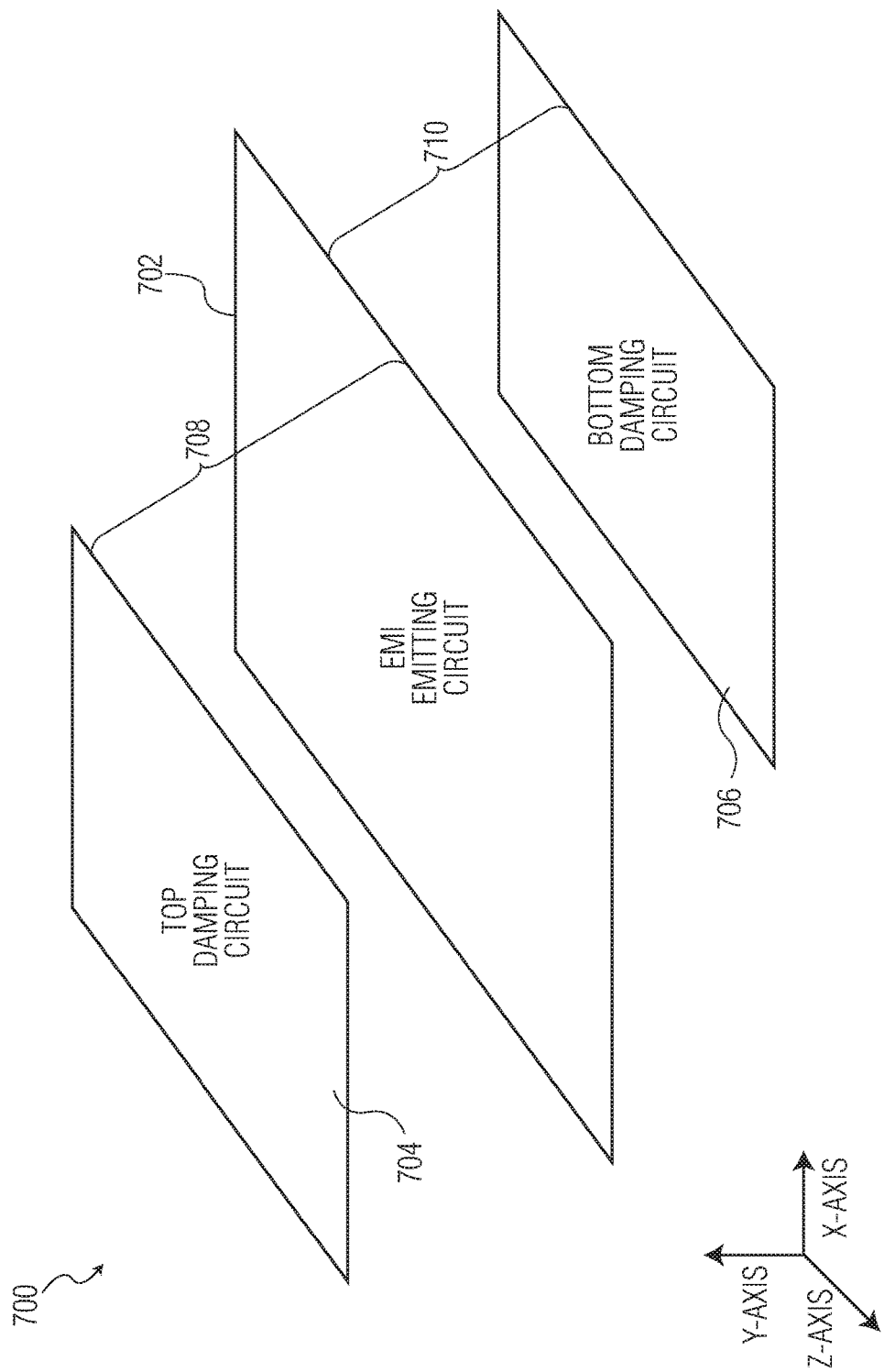
FIG. 7 is a sixth example of the electromagnetic device.

FIG. 7 is a sixth example 700 of the electromagnetic device. The sixth electromagnetic device 700 shows a multilayer example embodiment. The sixth electromagnetic device 700 shows an EMI emitting circuit 702 in a first layer, a top damping circuit 704 (e.g. canceling loop) in a second layer positioned above the first layer, and a bottom damping circuit 706 (e.g. canceling loop) in a third layer positioned below the first layer.

The top damping circuit 704 and the EMI emitting circuit 702 are separated by a first inter-layer distance 708. The bottom damping circuit 706 and the EMI emitting circuit 702 are separated by a second inter-layer distance 710. The first and second interlayer distances 708, 710 can be on the order of millimeters or micrometers depending upon a particular implementation and desired EMI reduction (e.g. canceling) effect.

Figure 8:
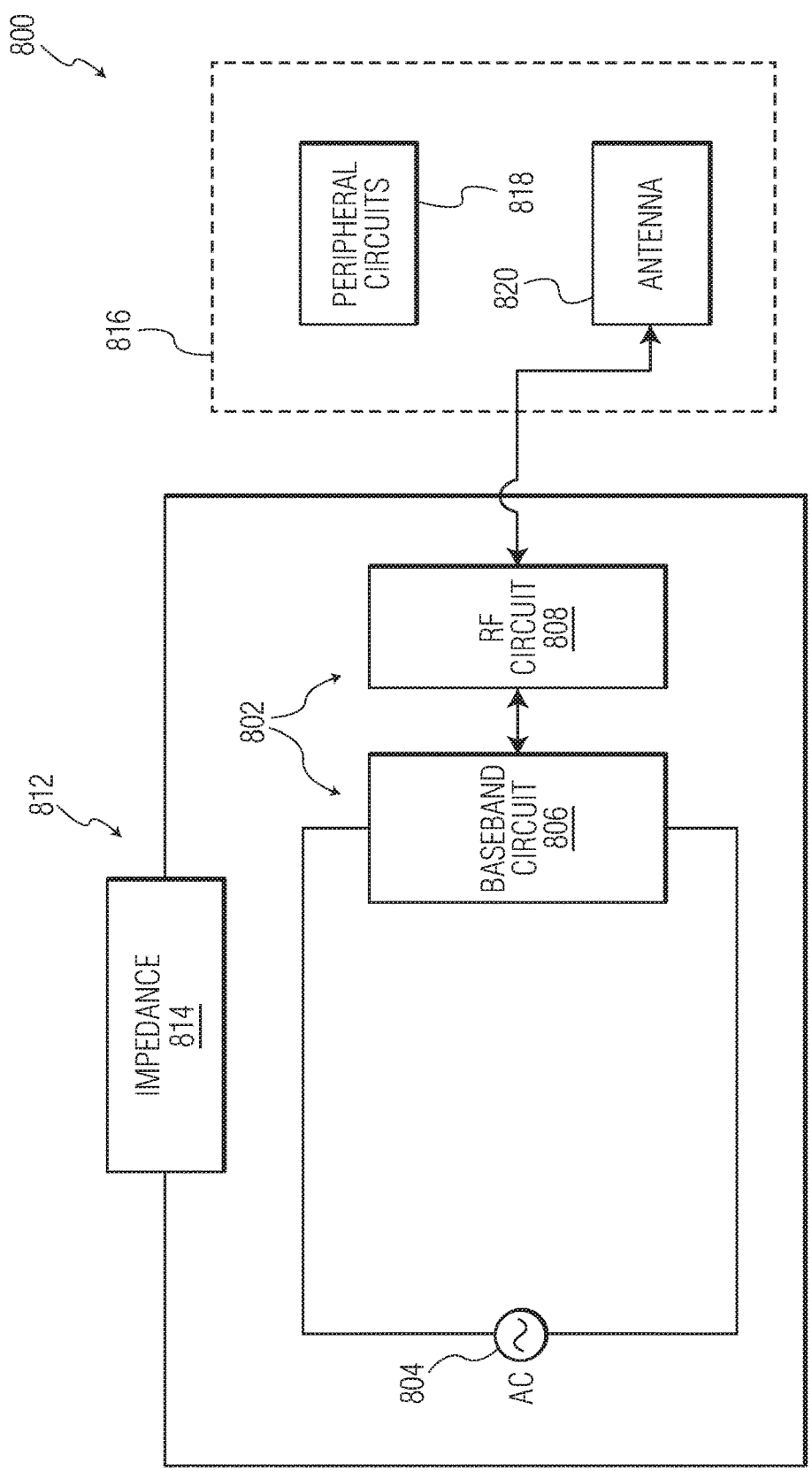
FIG. 8 is a seventh example of the electromagnetic device.

FIG. 8 is a seventh example 800 of the electromagnetic device. The seventh electromagnetic device 800 includes an EMI emitting circuit 802, a damping circuit 812, and a set of isolated circuits 816.

The EMI emitting circuit 802 includes a power source 804, a baseband circuit 806, and an RF circuit 808. The EMI emitting circuit 802 is electrically connected to an antenna 820.

The damping circuit 812 includes an impedance 814. The isolated circuits 816 include a set of peripheral circuits 818 and the antenna 820.

The seventh electromagnetic device 800 differs from the prior electromagnetic devices 100-400, 600 and 700 in that an explicit electrical connection between the EMI emitting circuit 802 and the antenna 820 is shown.

In this seventh example 800 the electronic communication device 800 can be a radio receiver, transmitter or transceiver) and the damping circuit 812 is tuned to reduce (i.e. damp) electromagnetic emissions not only from the power source, but also from the baseband circuit 806 and RF circuit 808 so as to minimize EMI coupling to the antenna 820.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. An electromagnetic device, comprising:
a first circuit, configured to generate a first electromagnetic field;
a second circuit responsive to the first electromagnetic field;
a damping circuit configured to generate a second electromagnetic field in response to a current induced by the first electromagnetic field;
wherein the second electromagnetic field reduces the second circuit's responsiveness to the first electromagnetic field; and
wherein the damping circuit is in a same plane as either the first circuit or second circuit.

2. The device of claim 1:
wherein the damping circuit forms an electrical loop around a portion of the first circuit.

3. The device of claim 1:
wherein the damping circuit forms an electrical loop around all elements within the first circuit.

4. The device of claim 1:
wherein the first circuit further includes a set of non-linear circuits and a set of external electrical interconnections; and
wherein the damping circuit encloses the non-linear circuits but does not enclose the set of external electrical interconnections.

5. The device of claim 1:
wherein the damping circuit is physically positioned with respect to the first and second circuits such that the second electromagnetic field reduces the second circuit's responsiveness to the first electromagnetic field.

6. The device of claim 1:
wherein the first electromagnetic field of the first circuit induces the current in the damping circuit that results in an opposite phase field according to Lenz's Law; and
wherein the opposite phase field at least partially cancels the first electromagnetic field at a position of the second circuit.

7. The device of claim 6:
wherein the damping circuit includes an impedance; and
wherein the impedance is configured to set an amplitude of the opposite phase field.

8. The device of claim 7:
wherein the impedance is a capacitor.

9. The device of claim 7:
wherein the electromagnetic device further includes a communications system; and
wherein the impedance is configured to maximize a signal to noise ratio in the communications system.

10. The device of claim 6:
wherein the damping circuit includes an impedance; and
wherein the impedance is a tunable impedance element configured to variably adjust an amplitude of the opposite phase field in response to an operational mode of the device.

11. The device of claim 6:
wherein the damping circuit includes a set of impedances configured to be switched into or out of the damping circuit so as to digitally adjust an amplitude of the opposite phase field in response to a set of operational modes of the device.

12. The device of claim 1:
wherein the first circuit includes a first set of electrical wires and the damping circuit includes a second set of electrical wires that are isolated from the first set of electrical wires.

13. The device of claim 1:
wherein the damping circuit is configured to reduce the second circuit's responsiveness to a near-field signal emitted by the first circuit.

14. The device of claim 1:
wherein the first circuit further includes at least one of: a transmitter, a receiver, or a transceiver.

15. The device of claim 1:
wherein the damping circuit partially surrounds the first circuit on a hard substrate and partially surrounds the first circuit with an electrical cable.

16. The device of claim 1:
wherein the electromagnetic device includes:
a first layer;
a second layer;
wherein the second layer is either above or below the first layer;
wherein the first circuit is within the first layer; and
wherein the damping circuit is within the second layer.

17. The device of claim 1:
further comprising a third circuit, configured to generate a third electromagnetic field;
wherein the second circuit is also responsive to the third electromagnetic field;
a second damping circuit configured to generate a fourth electromagnetic field in response to a current induced by the third electromagnetic field; and
wherein the fourth electromagnetic field reduces the second circuit's responsiveness to the third electromagnetic field.

18. The device of claim 1:
wherein the electromagnetic device is at least one of: an electronic communications device; an integrated circuit; a smartphone; a wearable device; a hearing aid; or a smartwatch.

19. The device of claim 1:
wherein the damping circuit is next to, and on a same substrate as, either the first circuit or the second circuit.

20. The device of claim 1:
wherein the damping circuit is a first damping circuit surrounding the first circuit; and
further comprising a second damping circuit surrounding the second circuit.

* * * * *